United States Patent
Bovino et al.

(10) Patent No.: US 7,382,660 B2
(45) Date of Patent: Jun. 3, 2008

(54) METHOD FOR ACCESSING A MULTILEVEL NONVOLATILE MEMORY DEVICE OF THE FLASH NAND TYPE

(75) Inventors: Angelo Bovino, Brunico (IT); Vincenzo Altieri, Ercolano (IT); Roberto Ravasio, Ponte San Pietro (IT); Rino Micheloni, Turate (IT); Mario De Matteis, Naples (IT)

(73) Assignees: STMicroelectronics S.R.L., Agrate Brianza (IT); Hynix Semiconductor Inc., Kyoungki-Do (KR)

( * ) Notice: Subject to any disclaimer, the term of this patent is extended or adjusted under 35 U.S.C. 154(b) by 7 days.

(21) Appl. No.: 11/458,904

(22) Filed: Jul. 20, 2006

(65) Prior Publication Data

US 2007/0047299 A1     Mar. 1, 2007

(30) Foreign Application Priority Data

Jul. 22, 2005    (EP) .................................. 05106783

(51) Int. Cl.
 *G11C 16/04*    (2006.01)
(52) U.S. Cl. .................... 365/185.28; 365/185.03; 365/185.17
(58) Field of Classification Search ............ 365/185.28
See application file for complete search history.

(56) References Cited

U.S. PATENT DOCUMENTS

| | | | |
|---|---|---|---|
| 6,288,935 B1 * | 9/2001 | Shibata et al. ......... | 365/185.03 |
| 6,456,528 B1 * | 9/2002 | Chen ...................... | 365/185.03 |
| 6,522,580 B2 * | 2/2003 | Chen et al. ............ | 365/185.02 |
| 7,057,939 B2 * | 6/2006 | Li et al. ................. | 365/185.28 |
| 7,224,614 B1 * | 5/2007 | Chan ...................... | 365/185.22 |
| 7,251,160 B2 * | 7/2007 | Li et al. ................. | 365/185.03 |
| 2004/0047183 A1 * | 3/2004 | Tanaka et al. ......... | 365/185.19 |
| 2005/0018488 A1 | 1/2005 | Kim et al. ............. | 365/185.28 |
| 2006/0120152 A1 * | 6/2006 | Lee et al. .............. | 365/185.03 |
| 2007/0171746 A1 * | 7/2007 | Tsao et al. ................... | 365/207 |

* cited by examiner

*Primary Examiner*—Son L. Mai
(74) *Attorney, Agent, or Firm*—Lisa K. Jorgenson; Robert Iannucci; Seed IP Law Group PLLC

(57) ABSTRACT

Multi-level programming allows for writing a first and a second bit in selected cells by separately programming the first bit from the second bit. Programming of the first bit determines a shifting from a first threshold level to a second threshold level. Programming of the second bit requires a preliminary reading to detect whether the first bit has been modified, performing a first writing step to bring the cell to a third threshold voltage if the first bit has been modified and performing a second writing step to bring the selected cell to a fourth threshold voltage different from the third threshold level if the first bit has not been modified. For increasing reading and program reliability, during preliminary reading of the second portion a reading result is forced to correspond to the first threshold level.

19 Claims, 10 Drawing Sheets

METHOD FOR ACCESSING A MULTILEVEL NONVOLATILE MEMORY DEVICE OF THE FLASH NAND TYPE

BACKGROUND OF THE INVENTION

1. Field of the Invention

The present invention relates to a method for accessing a multilevel nonvolatile memory device of the flash NAND type.

2. Description of the Related Art

As known, flash memories of the multilevel type are particularly delicate as regards reliability, due to the fact that each cell may store four different threshold voltage levels, instead of two, as in single level memories. In fact, the increase of the threshold voltage levels to be stored in each cell causes a reduction in the safety margins between contiguous threshold voltage distributions during reading, when it is necessary to discriminate a stored threshold among four possible ones, instead of between only two.

In view of the above, all the circuits and respective control algorithms are designed so as to ensure the correct operation of memories of the considered type. However, the present solutions do not exploit the higher design complexity in order to improve the memory reliability, instead of or in addition to only the access speed, using simple, quick and reliable measures.

In order to clarify this problem, reference is made to FIGS. 1 and 2, showing respectively the threshold voltage distributions of a single-level memory and a two-level memory. As shown in FIG. 1, in case of storing a single bit, just two voltage distributions are present, one for storing logical level "1" and one for storing logical level "0". Reading may be carried out comparing the stored threshold voltage with a reading voltage $V_R$; and reading may be carried out with a safety margin $\Delta 1$ between the reading voltage $V_R$ and each voltage distribution.

For a two-bit, four level memory, four voltage distributions are necessary, each for a different state A, B, C and D, e.g., corresponding to logical level "00", "01", "10" and "11". Reading requires comparison of the stored threshold voltage with three different reading voltages $V_{R1}$, $V_{R2}$, $V_{R3}$, and the safety margin is here $\Delta 2$, lower than $\Delta 1$.

The above problem of data reliability is particularly felt when reading specific data, correctness whereof must be ensured with an even higher precision. This is the case for example of the data stored in the so-called "sector 0" (sector with address 00h) which generally stores the boot information for the system using the memory device.

Presently, the only way to ensure a higher reliability of the "sector 0" is to introduce substitution algorithms which logically remap the content of the "sector 0" in another redundancy sector when, during the EWS (Electrical Wafer Sorting) test, problems are encountered in the physical sector implementing the "sector 0". This solution does not affect however the safety margins, so that "sector 0" (either the original one or the redundancy one) is read with the same accuracy and reliability as standard sectors of a multilevel memory, lower than for single-bit memories.

BRIEF SUMMARY OF THE INVENTION

According to one embodiment of the present invention, a method for accessing a multilevel nonvolatile memory device includes programming a first bit in a selected cell of the memory device and separately programming a second bit in the selected cell. The step of programming the first bit includes shifting the selected cell from a first threshold level to a second threshold level. The step of separately programming the second bit further includes the steps of preliminary reading the selected cell to determine whether the first bit has been modified, performing a first writing to bring the selected cell to a third threshold level if the first bit has been modified, and performing a second writing to bring the selected cell to a fourth threshold level different from the third threshold level, if the first bit has not been modified.

According to another embodiment of the invention, a multilevel nonvolatile memory device includes a plurality of cells, means for programming a first bit in a selected cell of the plurality of cells and means for separately programming a second bit in the selected cell. The means for programming the first bit includes means for shifting the selected cell from a first threshold level to a second threshold level. The means for separately programming the second bit includes means for preliminary reading the selected cell to determine whether the first bit has been modified, means for performing a first writing step to bring the selected cell to a third threshold level if the first bit has been modified, and means for performing a second writing step to bring the selected cell to a fourth threshold level different from the third threshold level if the first bit has not been modified.

BRIEF DESCRIPTION OF THE SEVERAL VIEWS OF THE DRAWING(S)

For an understanding of the present invention, a preferred embodiment is now described, purely as a non-limitative example, with reference to the enclosed drawings, wherein.

DETAILED DESCRIPTION OF THE INVENTION

Figure 3:
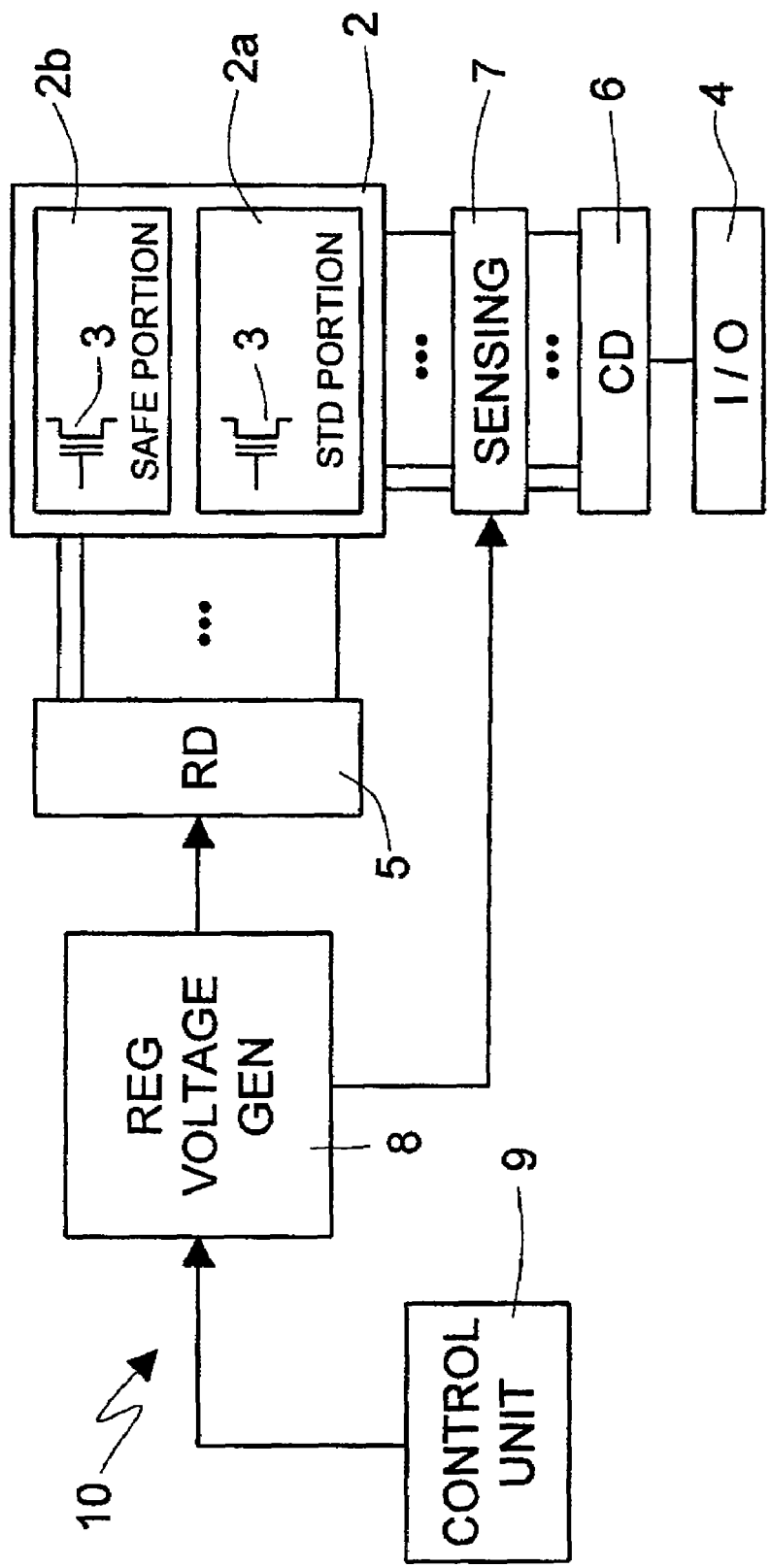
FIG. 3 shows the basic structure of a NAND flash memory device for implementing an embodiment of the present method.

FIG. 3 shows the structure of a memory device 10 of the NAND type, implementing the present method. The memory device 10 comprises an array 2 of cells 3 arranged in rows and columns, an I/O buffer 4, a row decoder circuit 5, a column decoder circuit 6, a sensing stage 7, a regulated voltage generator 8 and a control unit 9, connected as known in the art.

Figure 4:
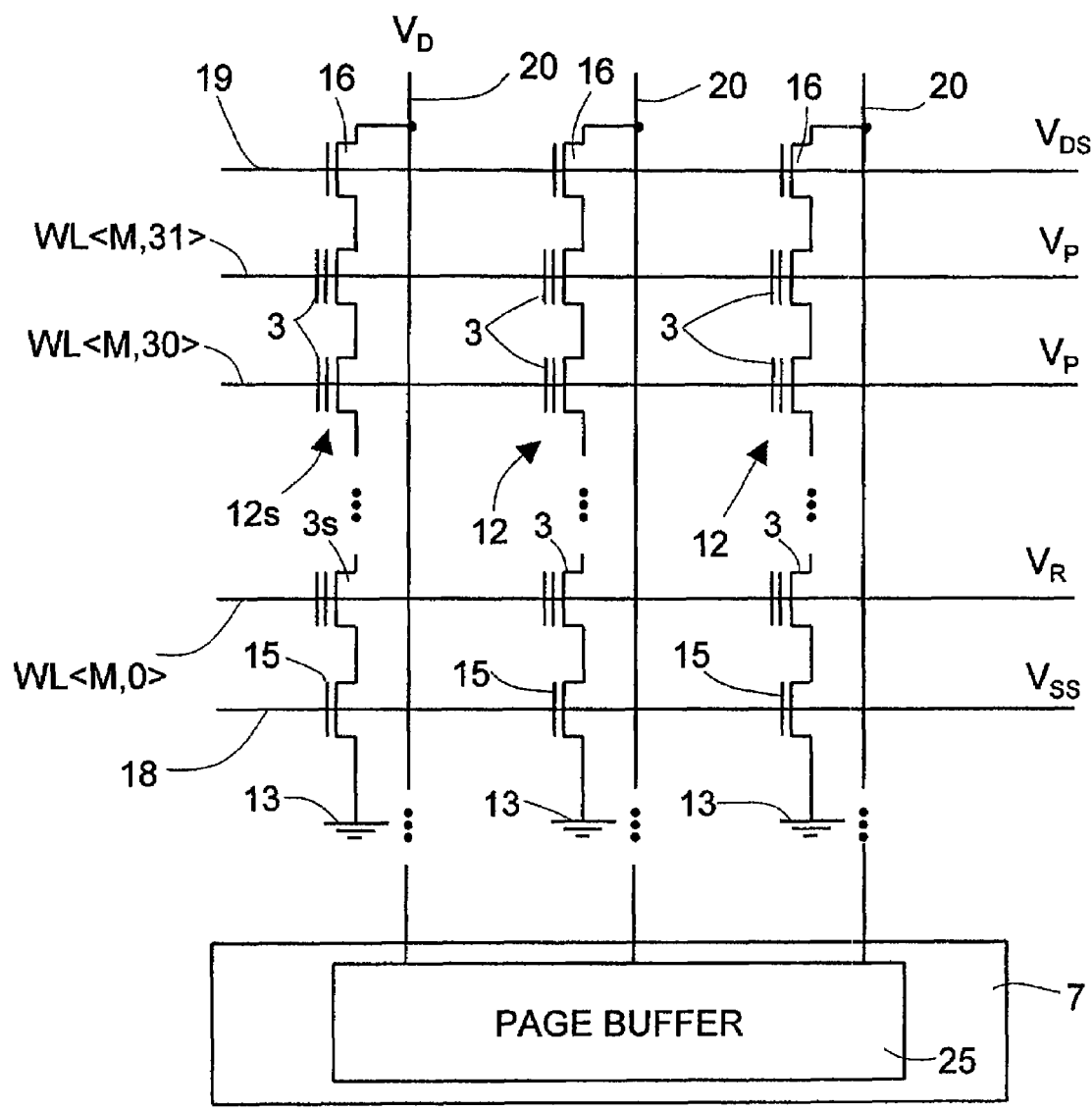
FIG. 4 shows the architecture of the memory array for the device of FIG. 4.

With reference to FIG. 4, cells 3 arranged on a same column are associated to a same bitline 20. More precisely, cells 3 of a same column are series connected in groups, normally of 16 or 32 elements, to form so-called strings or stacks, indicated at 12. The stacks 12 are selectively connectable to the respective bitline 20 through respective drain selectors 16 and to a common ground line or region, indicated schematically at 13, through respective source selectors 15. The source selectors 15 arranged on a same row have their gate terminals connected to a same source select line 18 and the drain selectors 16 arranged on a same row have their gate terminals connected to a same drain select line 19. Moreover, the bitlines 20 are connected to a respective page buffer circuit 25 belonging to the sensing stage 7 and operating both as an internal buffer for the data to be written and read and as a sensing circuit during reading.

Gate terminals of cells 3 arranged on a same row are connected to a same wordline (e.g., WL<M,0>, ..., WL<M,N>, ..., WL<M,31>). Appropriate voltage levels are supplied to the wordlines WL<M,0>, WL<M,1>, ..., WL<M,31>, the source select line 18 and the drain select line 19 by controlling the regulated voltage generator 8 (FIG. 3).

NAND memory reading is usually based on charge integration and exploits the parasitic capacitance associated to each bitline 20. When a cell 3 is selected for reading (selected cell 3s), the page buffer circuit 25 supplies an integration current to a selected bitline 20, to cause charging thereof to a predetermined drain read voltage $V_D$ (e.g., 1.2 V to 1.4 V). Moreover, the wordline WL coupled to the gate terminal of the selected cell 3s (e.g., wordline WL<M,0>) is biased to a read voltage $V_R$ and wordlines coupled to the other cells 3 in the same stack (selected stack 12s) are biased to a pass voltage $V_P$ higher than the highest threshold voltage of the cells 3 (e.g., for a two-bit memory device $V_P$=5.5 V), so that all the cells 3 in the selected stack 12s are on. Selected cell 3s is switched on allowing a current to flow only if its own threshold voltage is lower than the read voltage $V_R$, as well known to those skilled in the art.

If the selected cell 3s is on, it causes the selected bitline 20 to discharge to ground; otherwise the voltage on the selected bitline 20 remains substantially unchanged. The page buffer circuit 25 then senses the voltage on the selected bitline 20 and generates an output data (i.e., a reading result), which is sent to the I/O buffer 4 through the column decoder circuit 6 of FIG. 3.

In the memory device 10 of FIG. 3, the array 2 is divided into a standard portion 2a, where the cells 3 are programmed using four levels (and thus store two bits each), and a safe portion 2b, where the cells 3 are programmed using two levels (and thus store one bit each).

The safe portion 2b may include a separate sector of the array 2, a portion of a sector, for example one or more physical pages or words, or even portions of a word, as discussed below in more detail.

Figure 1:
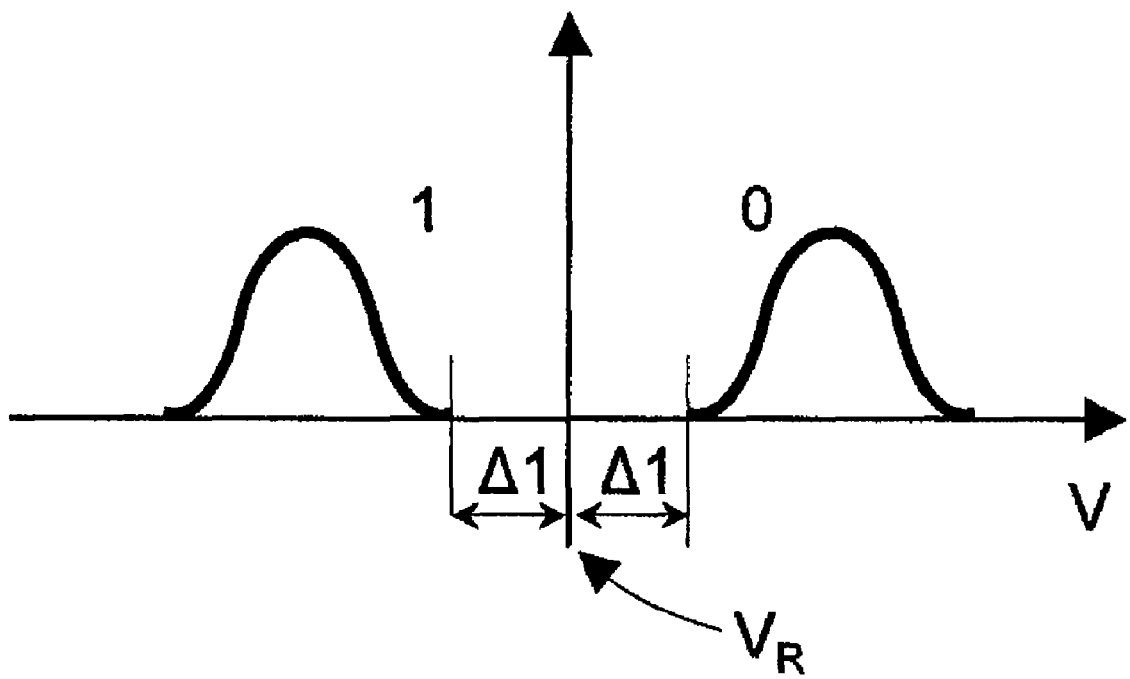
FIGS. 1 and 2 illustrate conventional voltage distributions associated to the storage of data in a single-bit and in a two-bit memory, respectively.
Figure 2:
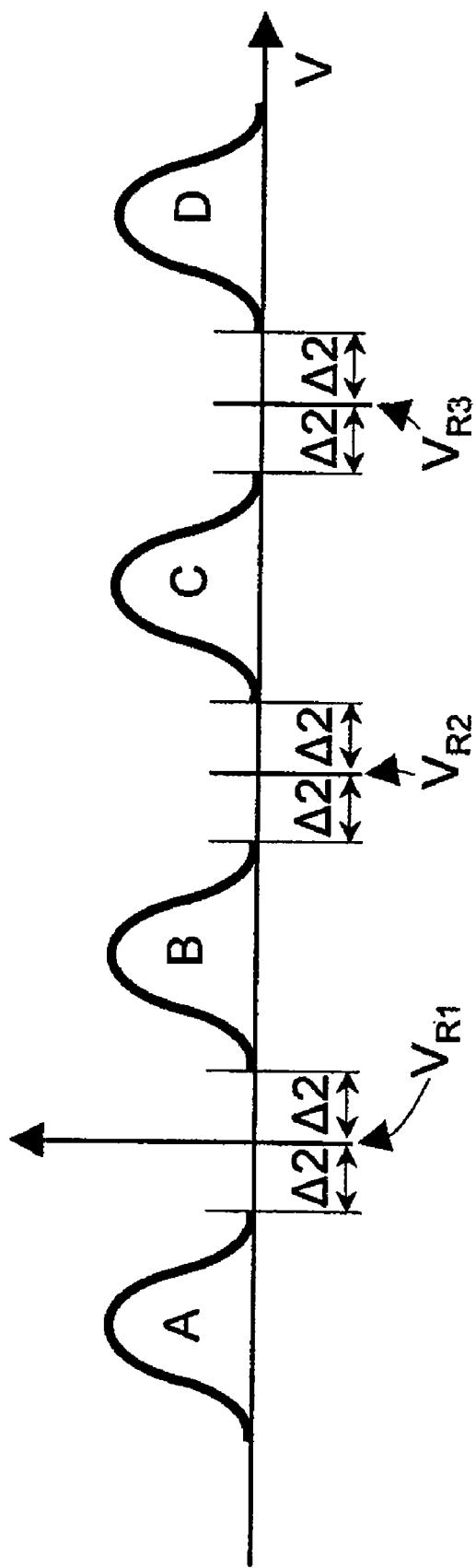
Figure 5:
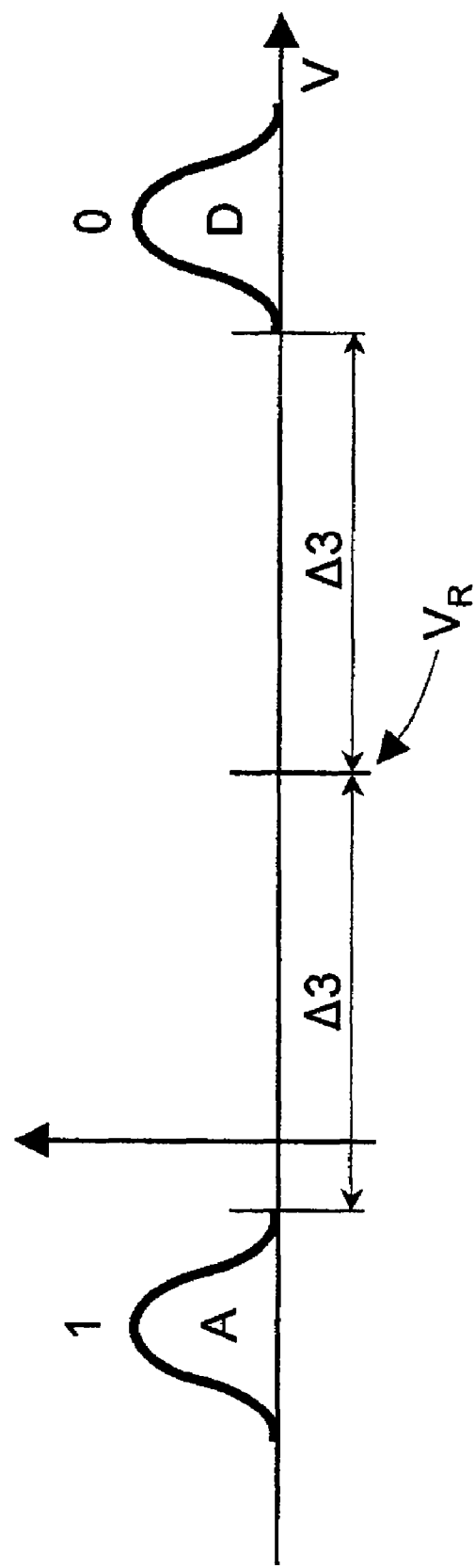
FIG. 5 shows the desired voltage distributions associated to the storage of data in critical portions of the memory device according to an embodiment of the invention.

For ensuring a higher reliability, the safe portion 2b uses two outermost threshold voltage distributions, as shown in FIG. 5. Using the outermost distributions A and D for respectively storing, e.g., bits "1" and "0", a safety margin Δ3 is obtained, which is higher than safety margin Δ2 of FIG. 2, thus increasing reading reliability.

Furthermore, in order to read and program the bits of the safe portion 2b in the same way as the bits stored in the standard portion 2a of the array 2, data are organized using a Gray sequence, and memory is organized to read the two bits to be stored in each cell 3 of the standard portion 2a as each belonging to a distinct logical page.

Figure 6:
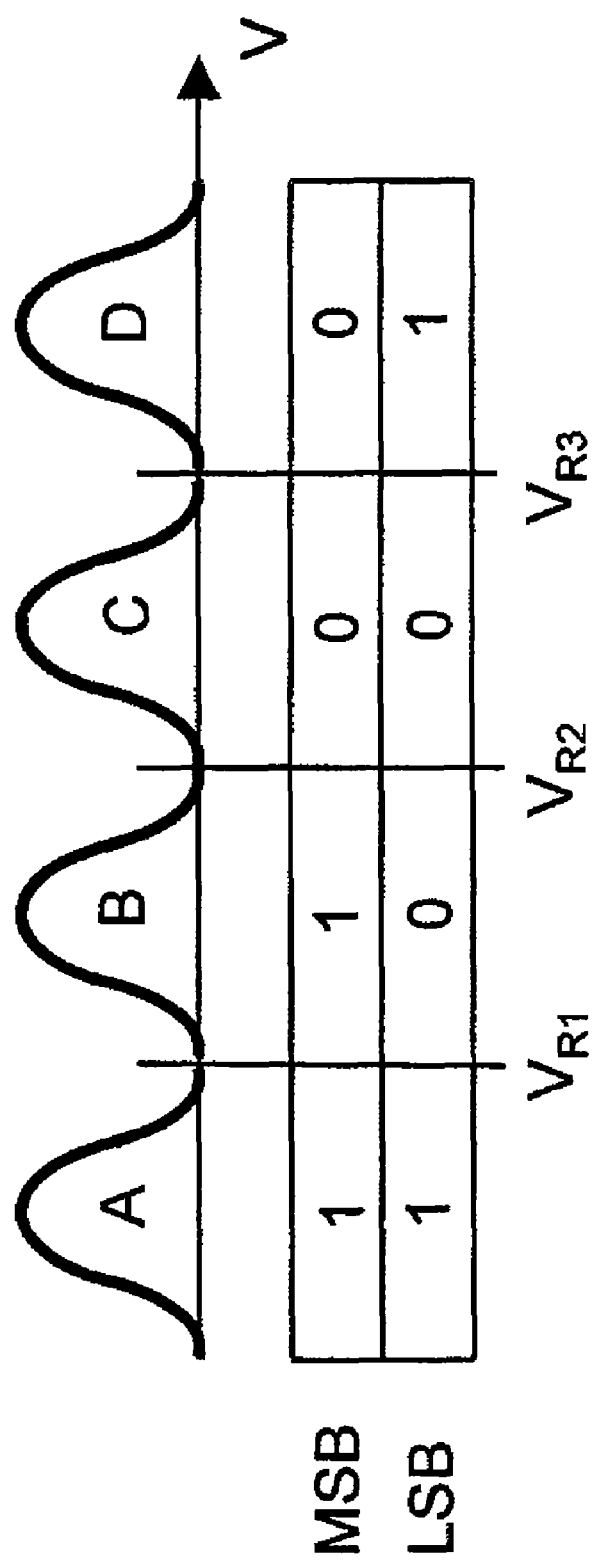
FIG. 6 shows the voltage distributions associated to the storage of data in standard portions of the memory device of FIG. 4, according to an embodiment of the invention.

In particular, the four threshold voltage distributions used for the standard portion 2a are associated to the two bit sequences that may be stored in each cell 3 in the following order: "11" (distribution A), "10" (distribution B), "00" (distribution C) and "01" (distribution D), as represented in FIG. 6.

Figure 7:
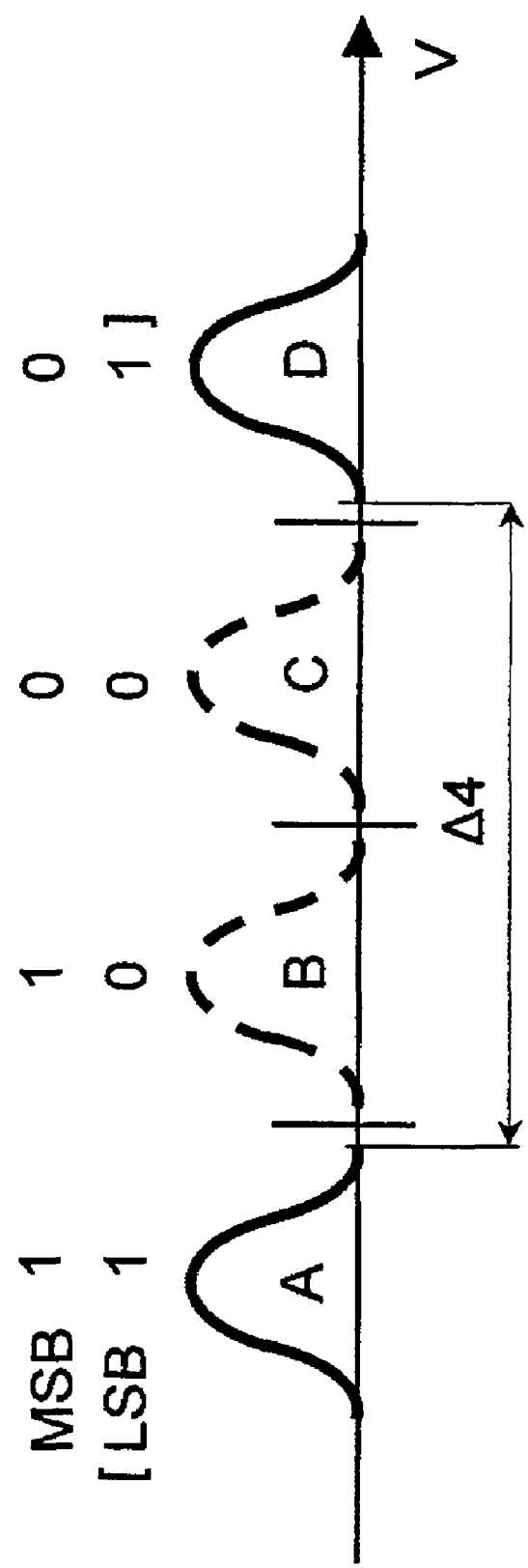
FIG. 7 shows voltage distributions associated to the storage of data in the critical portions of the memory device, according to an embodiment of the invention.

Thereby, the cells of the safe portion 2b use only the two extreme threshold voltage distributions so that distribution A represents value "1" and distribution D represents value "0", as visible from FIG. 7.

Furthermore, in the array 2, the two bits stored in a same cell 3 are associated to distinct logical pages and are read and written independently from each other, in particular as regards an addressing bit that distinguish the two pages (logical page address).

In this situation, the pages are programmed according to an increasing address order, that is the two logical pages associated to the same physical page (word) are programmed in the following order: first, the least significant bit (LSB) and then the most significant bit (MSB).

With the architecture of the array 2 shown in FIG. 3, the LSB of cells belonging to the safe portion 2b (i.e., the LSB of safe cells) is not accessible to the user and is always equal to "1"; thereby programming a safe cell only affects the most significant bit, which stores the meaningful information. This causes a loss of capacity related to the loss of a logical page for each physical page.

An embodiment of a program method using the above explained data organization is described hereinbelow, making reference to FIG. 8. It is assumed that any operation of programming is preceded by a cancellation operation, which causes selected cells (belonging to blocks to be programmed) to have a threshold voltage belonging to distribution A (thus, the cells to be programmed are first brought to state "11"). Furthermore, here, programming is an operation involving the injection of electrons in the floating gate of the selected cells, and thus raises their threshold voltages. The following description is furthermore made with reference to the programming of a single cell 3; however, programming generally involves a plurality of cells 3, e.g., all cells belonging to a word (cells connected to a same wordline WL of FIG. 4).

In particular, for programming a cell 3 belonging to the standard portion 2a, first the LSB is programmed to bring the cell 3 from distribution A to distribution B (LSB programming). Then, the MSB is programmed. To this end, first the LSB is read to know if the cell has its threshold voltage comprised in the distribution A or in the distribution B (preliminary reading). In fact, due to the separation of the logical pages, the previously programmed LSB are not known and the method exploits the fact that, if the threshold voltage of a cell 3 is in the distribution A (LSB=1) and the MSB is to be programmed (MSB=0), the cell 3 must be brought to distribution D (corresponding to "01", see FIG. 6); if however the threshold voltage is in the distribution B (LSB=0) and the MSB is to be programmed (MSB=0), the cell must be brought to distribution C (corresponding to "00", see FIG. 6). In this way, cells that should store bits "11", remain in the cancelled condition, cells to be programmed to "10" are subjected to only the LSB programming (only the LSB is to be changed); cells to be programmed to "00" are subjected to both LSB programming and MSB programming (the latter, just only up to distribution C) and cells to be programmed to "01" are subject only to MSB programming (up to distribution D).

In case of the safe portion 2b, the programming algorithm and the step of programming the MSB is modified so that the outcome of the preliminary reading step is always "1". This can be done either by reading the cell and forcing the reading result to be "1" or skipping the preliminary reading step and directly forcing the reading result to be "1". Then, the MSB is programmed in the same way indicated above.

Thereby, the safety margin is increased with respect to a situation where no forcing is carried out. In fact, the cells are read during the preliminary reading using read voltage $V_{R1}$ (see FIG. 6). Without any forcing, the preliminary reading of any marginal cell 3 may result in LSB=0, meaning that the cell 3 is in distribution B. The same can happen in case of an erroneous reading. In such a case, the algorithm would cause programming of the MSB to bring the cell into distribution C, which is still correct (as will become clear from the following description of the reading operation, making reference to FIGS. 9 and 10) because distribution C is higher than reading voltage $V_{R2}$ used for reading the MSB in a reading process (and thus would give rise to the correct outcome during reading), but has a smaller safety margin (just equal to the standard safety margin $\Delta 2$ of FIG. 2). On the contrary, by forcing the result of the preliminary reading step to be a "1", the safe cell 3 is programmed to bring its threshold to distribution D, raising the safety margin (safety margin $\Delta 4$ of FIG. 7).

Reading includes two different reading steps using reading voltages $V_{R1}$ and $V_{R3}$ to acquire the value of the LSB. The outcomes of these reading steps allow to identify the cells 3 belonging to distribution A or to distribution D (LSB=1); the other cells belong to distribution B or C and have LSB=0. Then the MSB is read, performing a reading using reading voltage $V_{R2}$; the cells having a lower threshold voltage belong to distribution A or B and have MSB=1; the others belong to distribution C or D and have MSB=0.

Figure 8:
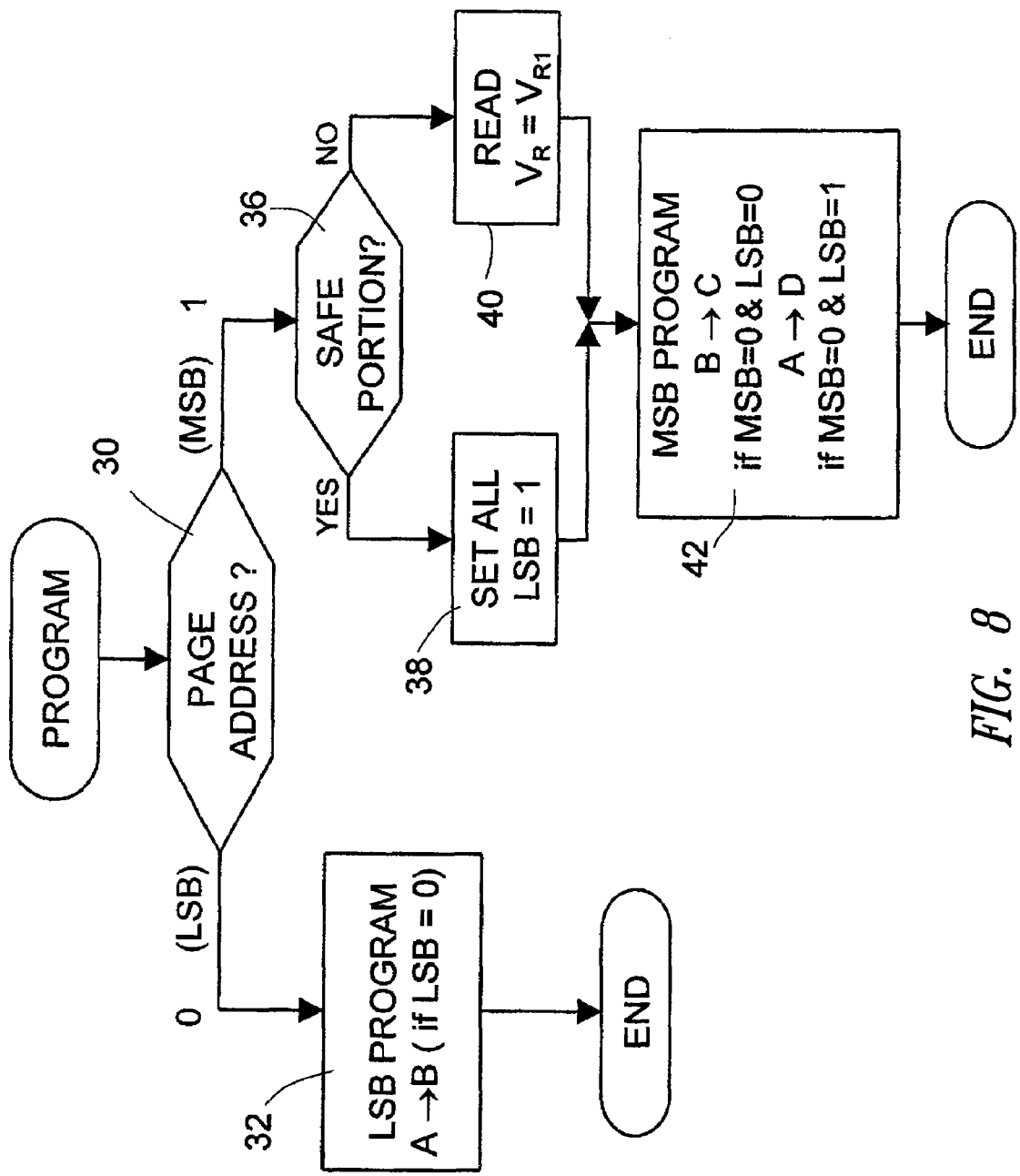
FIGS. 8-10 show flow-charts of programming and reading steps according to embodiments of the invention.

Hereinbelow, reference will be made to FIG. 8 showing a schematic representation of the programming algorithm implementing the above described principles.

First, on the basis of the value of page address bit A(l), it is decided whether the LSB (A(l)=0) or the MSB (A(l)=1) has to be programmed, block 30. If A(l)=0, LSB programming is carried out simultaneously for an entire bit page, for example including 2K bits, block 32. In particular, as obvious to those skilled in the art, in the selected page only the cells 3 are programmed for which LSB=0. LSB programming is a simple single-level writing operation, by virtue of the sequential programming described above, and is carried out in a standard way, e.g., applying a number of programming pulses followed by verifying steps until the correct threshold is detected for all the cells 3 whose LSB is to be programmed. Thereby, the selected cells 3 are brought from the voltage distribution A corresponding to bit sequence "11" to voltage distribution B corresponding to bit sequence "10" (see FIG. 6). Then LSB programming ends.

If A(l)=1, MSB programming is carried out. In this case, it is necessary to distinguish if the considered page is a safe one or not, decision block 36 (as explained in greater detail hereinafter, the "safe" status of a cell 3 to be programmed is either evident from its address or derived from a peculiar command sent to the control unit 9 of FIG. 3).

If the page to be programmed is a "safe" one (output YES from block 36), all LSB of the cells 3 belonging to the safe page are set to 1, and no reading is effected at all, block 38; if not (output NO from block 36), the LSBs are read using reading voltage $V_{R1}$ (block 40). In the alternative, the reading step of block 40 is made independently of the selected page belonging to standard portion 2a or safe portion 2b, and, in the latter case, the reading result is then forced to be "1". In both cases, after acquiring by reading or forcing the value of the LSB (after block 38 or block 40), programming of the MSB is carried out, block 42. In particular, the cells 3 having LSB=0 (the cell thresholds, just read, are in distribution B) are programmed to distribution C; if LSB=1 (the cell thresholds are in distribution A or the page is a safe one whose LSB has been forced to 1), the cells 3 are programmed to distribution D.

Then programming is ended.

Figure 9:
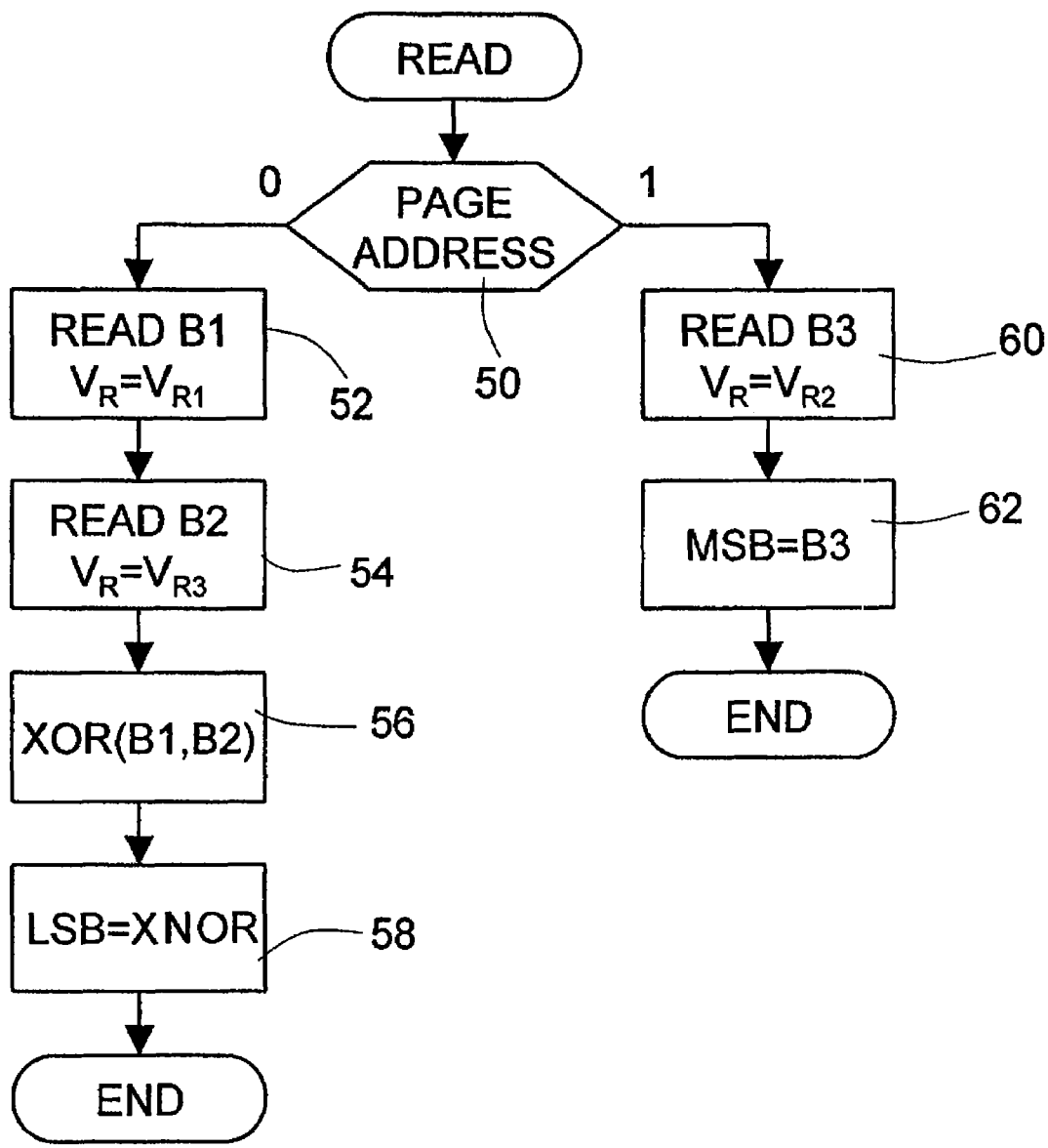

FIG. 9 is a schematic representation of the reading algorithm implementing the principles above described.

Initially, on the basis of the value of page address bit A(l), it is decided whether the LSB (A(l)=0) or the MSB (A(l)=1) has to be read, block 50. If A(l)=0, the cells 3 belonging to the addressed page are simultaneously read using reading voltage $V_{R1}$ (block 52). The result of the reading is an array indicated by B1, including e.g., 2K bits. Then (although the order is not important), the cells 3 belonging to the addressed page are simultaneously read using voltage $V_{R3}$ (block 54). The result of the reading is an array indicated by B2.

After both readings, the page buffer 25 of FIG. 4 calculates the XOR of B1 and B2, bit by bit, for the entire page, block 56; the inverted value of the XOR array gives the LSB, block 58. In fact, the cells 3 whose reading outputs B1 and B2 are both "1" or both "0" and the XOR value is thus "0", are in distribution A or D (thus, LSB=1), while the cells 3 having B1="0" and B2="1", (XOR="1"), are in distribution B or C; thus, LSB=0. Then, LSB reading ends.

If A(l)=1, MSB reading is carried out, using reading voltage $V_{R2}$ (block 60). In this case, the reading output array B3 directly includes the value of the MSB (block 62). In fact, the cells 3 that have threshold voltages lower than $V_{R2}$ are in distribution A or B and have MSB="1"; the cells 3 that have threshold voltages higher than $V_{R2}$ are in distribution C or D and have MSB="0". Then MSB reading is ended.

In applications of the present method requiring a direct boot from the memory ("autoread" procedure) the reading program requires a modification. In fact, such applications generally require an immediate and automatic read of a page 0. However, with the present architecture, the page 0 is an LSB page. If the boot information is stored in the safe portion 2b (FIG. 3) the first meaningful page thereof is instead page 1 (virtual page corresponding to the MSB of the physical page). Thus, it is necessary to force (i.e, change) the address of the page to be read from 0 to 1 (forcing to 1 of the logic page address bit) if reading/writing of information from the safe portion 2b is recognized.

The memory device 10 of FIG. 3 can manage reading of the safe portion 2b in two ways. According to a first possibility, the user sends a special command to the control unit 9 when the safe portion 2b is to be read. In the alternative, the safe portion 2b is configured as a protected portion and is managed as such directly by the control unit 9, without the need of having particular commands for accessing it. The information regarding which portion of the array 2 is the safe portion is stored in a non-volatile manner, e.g., in the array 2 itself, in particular in a dedicated sector (extra-block) which is managed internally as a super-protected sector (thus, belonging to safe portion 2b of FIG. 3). In this case, the address of this dedicated sector may be transferred to volatile registers during the boot and be readily available to the control unit 9 to compare with the addresses of the cell 3 to be read received from the user, for a fast access.

Figure 10:
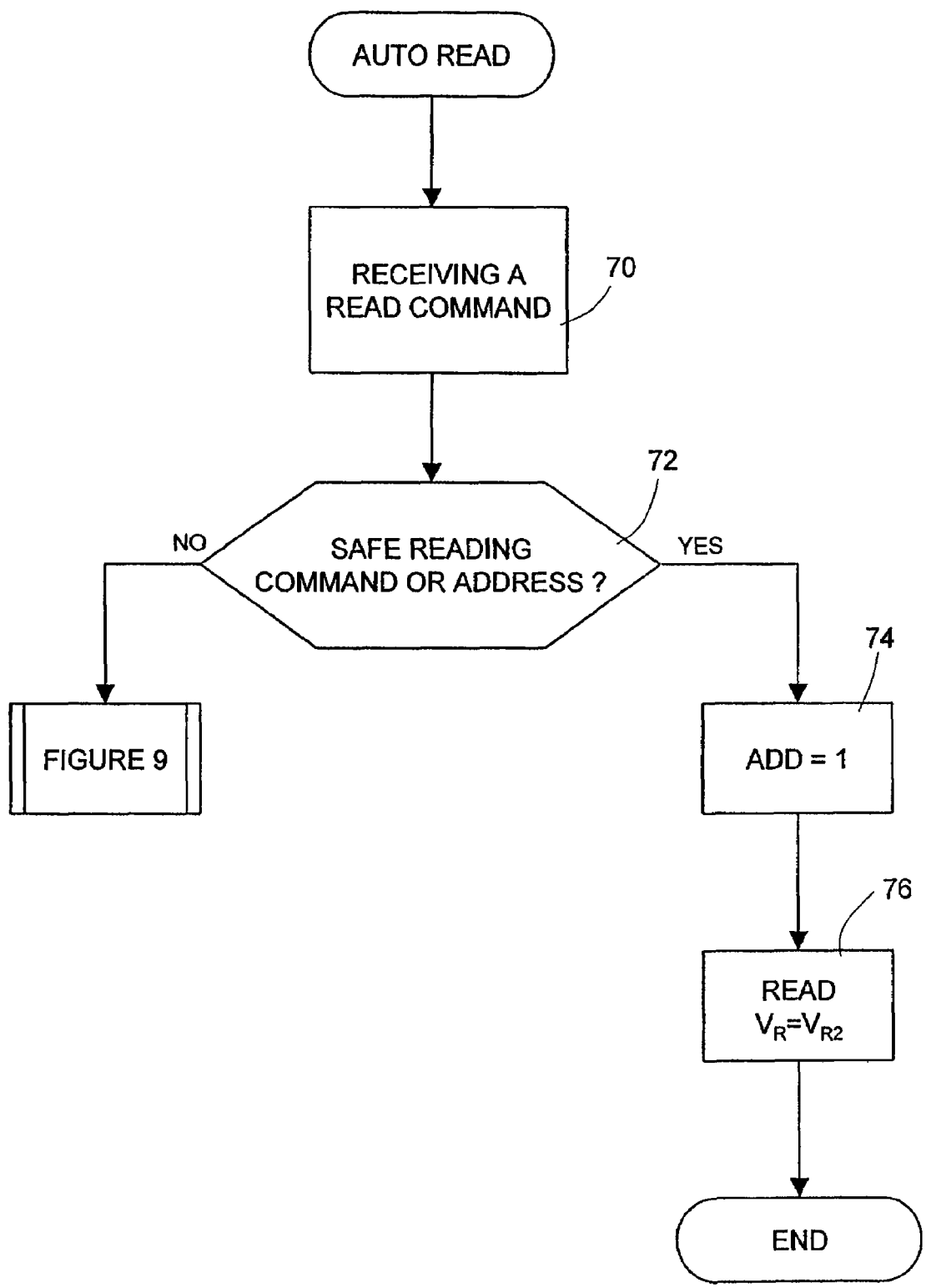

The reading operations allowing a direct reading of the "sector 0" and/or of other or all parts of the safe portion 2b are represented schematically from the flow-chart of FIG. 10, and include receiving a read command, block 70; deciding if the read command is directed to a safe cell, according to the specific command or the cell address, block 72; if a multilevel reading is to be performed (output NO from block 72), the procedure of FIG. 9 is followed; if a single-bit reading is to be performed (output YES from block 72), the address of the selected cell is modified to address the MSB, block 74 and a reading operation is performed using reading voltage $V_{R2}$, block 76.

As indicated above, the safe portion 2b may include also parts of a word (or wordline WL), for example in particular a spare region, where generally important data/information are stored such as pointers, access bit, sector validity bit, redundancy bit, etc.

When the safe portion 2b includes only a portion of a physical page or word, programming is made in two steps: e.g., first data are programmed in the standard portion 2a, using the two-bit modality; then, the safe portion 2b is programmed in the safe way, by forcing the outcome of the preliminary reading to 1.

The safe portion 2b of the array 2 may include a preset portion thereof, dedicated to the storing of important data, such as extra-blocks, or may be programmed suitably according to the specific requirements of the user and the intended application, in which case the address of the safe portion 2b is stored by the user or in the spare blocks, as above described.

The embodiments of the present method and memory provide increased reliability for the safe portion thereof, as above demonstrated. Reading and writing can be enabled, however, in the same way for the standard and the safe portions, thus ensuring easy, fast and controllable operations.

Finally, it is clear that numerous variations and modifications may be made to reading/programming methods and to the memory described and illustrated herein, all falling within the scope of the invention as defined in the attached claims.

The invention claimed is:

1. A method for accessing a multilevel nonvolatile NAND memory device, comprising:
    multi-level programming the memory device by writing a first and a second bit in a selected cell of said memory device, the multi-level programming including the steps of:
        programming the first bit in said selected cell, said step of programming the first bit including shifting said selected cell from a first threshold voltage to a second threshold voltage; and
        separately programming the second bit in said selected cell, said step of separately programming further including the steps of:
            preliminarily reading the selected cell to determine whether said first bit has been modified,
            performing a first writing by bringing said selected cell to a third threshold voltage if said first bit has been modified, and
            performing a second writing by bringing said selected cell to a fourth threshold voltage different from said third threshold voltage, if said first bit has not been modified, wherein said memory device comprises:
    a first portion including cells storing plural threshold voltages corresponding to a plurality of bits; and
    a second portion including cells storing two threshold voltages corresponding to a single bit, wherein said step of preliminary reading said selected cell includes a step of forcing a reading result to correspond to a threshold voltage when said selected cell belongs to said second portion.

2. The method according to claim 1, wherein said plural threshold voltages represent a sequence of logical levels "11", "10", "00" and "01" and correspond respectively to said first, second, third and fourth threshold voltages, said two threshold voltages stored in said second portion represent logical levels "11" and "01" of said sequence, said step of programming the first bit includes shifting said selected cell from "11" to "10", said step of separately programming includes shifting said selected cell from "11" to "01" if said first bit has not been modified and from "10" to "00" if said first bit has been modified, and wherein said step of forcing includes forcing said reading result to "1", to correspond to said first threshold voltage.

3. The method according to claim 2, wherein said step of preliminarily reading the selected cell is carried out using a reading voltage intermediate between said first and second threshold voltages when said selected cell belongs to said first portion.

4. The method according to claim 2, wherein said step of preliminarily reading comprises skipping a reading operation and setting said reading result to "1".

5. The method according to claim 3, wherein said step of preliminarily reading the selected cell is carried out using a reading voltage intermediate between said first and fourth threshold voltage and then setting said reading result to "1" when the selected cell belongs to said second portion.

6. The method according to claim 2, further comprising a multi-level reading operation including:
    a first reading step using a reading voltage intermediate between said first and second threshold voltages;
    a second reading step using a reading voltage intermediate between said third and fourth threshold voltages; and
    a third reading step using a reading voltage intermediate between said second and third threshold voltages, said first and second reading steps defining an LSB reading and said third reading step defining an MSB reading.

7. The method according to claim 6, further comprising a single-bit reading operation including the steps of:
    receiving a reading command including a cell address;
    determining if a cell corresponding to the cell address belongs to said first portion of the memory device or to said second portion of the memory device;
    if said cell belongs to said first portion, performing said multi-level reading operation; and
    if said cell address belongs to said second portion, amending said cell address to perform only said MSB reading.

8. The method according to claim 7, wherein said step of receiving a reading command comprises receiving a first command for reading a first cell in said first portion and receiving a second command for reading a second cell in said second portion.

9. The method according to claim 7, wherein said step of determining comprises comparing said cell address as received with stored addresses and said step of amending comprises amending said cell address to perform only said MSB reading if the cell address as received is equal to one of said stored addresses.

10. The method according to claim 1, wherein said second portion comprises one of the following: a separate sector, a portion of a sector, a word, a plurality of adjacent words, portions of a word, a spare region, an extra-block, or a plurality of extra-blocks.

11. The method according to claim 1, wherein said step of programming comprises programming the first bit in said selected cell of said first portion and the first bit in said selected cell of said second portion at different times.

12. A multilevel nonvolatile NAND memory device, comprising:
    a plurality of cells;

means for programming a first bit in a selected cell of the plurality of cells, said means for programming the first bit including means for shifting said selected cell from a first threshold voltage to a second threshold voltage; and means for separately programming a second bit in said selected cell, said means for separately programming a second bit including:
means for preliminarily reading the selected cell to determine whether said first bit has been modified,
means for performing a first writing step to bring said selected cell to a third threshold voltage if said first bit has been modified, and
means for performing a second writing step to bring said selected cell to a fourth threshold voltage different from said third threshold voltage if said first bit has not been modified a first portion including cells storing plural threshold voltages corresponding to a plurality of bits; and a second portion including cells storing two threshold voltages corresponding to a single bit, wherein said means for preliminarily reading the selected cell includes means for forcing a reading result to correspond to said first threshold voltage when the selected cell belongs to said second portion.

13. The device according to claim 12, further comprising:
means for reading the first and second bits of the selected cell when the selected cell belongs to the first portion; and
means for reading the single bit of the selected cell when the selected cell belongs to the second portion.

14. The device according to claim 13, wherein the means for reading the first and second bits includes a regulated voltage generator configured to:
apply a reading voltage intermediate between the first and second threshold voltages and apply a reading voltage intermediate between the third and fourth threshold voltages to define an LSB reading; and
apply a reading voltage intermediate between the second and third threshold voltages to defining an MSB reading.

15. The device according to claim 13, wherein the means for reading the single bit includes:
a control unit configured to receive a reading command including a cell address for the selected cell and amend the cell address to perform only a MSB reading; and
a regulated voltage generator configured to apply a reading voltage intermediate between the second and third threshold voltages, the fourth reading step defining the MSB reading.

16. A method for accessing a selected cell of a multilevel nonvolatile NAND memory device, comprising:
shifting, if the selected cell belongs to a second portion of the memory device in which individual cells are each configured to store any of four threshold voltages corresponding to a MSB and a LSB and when the LSB is to be programmed, a threshold voltage of the selected cell from a first threshold voltage to a second threshold voltage; and performing, if the selected cell belongs to the second portion and when the MSB is to be programmed, the steps of:
preliminarily reading the selected cell to determine whether the LSB has been programmed,
shifting the threshold voltage of the selected cell from the second threshold voltage to a third threshold voltage if the LSB has been programmed, and
shifting the threshold voltage of the selected cell from the first threshold voltage to a fourth threshold voltage if the LSB has not been programmed; and shifting, if the selected cell belongs to a first portion of the memory device in which individual cells are configured to store either of two threshold voltages corresponding to a bit and when the bit is to be programmed, the threshold voltage of the selected cell from the first threshold voltage to the fourth threshold voltage.

17. The method of claim 16 further comprising, if the selected cell belongs to the second portion, the steps of:
a first reading using a reading voltage intermediate between the first and second threshold voltages;
a second reading using a reading voltage intermediate between the third and fourth threshold voltages; and
a third reading using a reading voltage intermediate between the second and third threshold voltages, the first and second reading steps for obtaining the LSB and the third reading step for obtaining the MSB.

18. The method of claim 16, wherein the first threshold voltage is less than the second threshold voltage, the second threshold voltage is less than the third threshold voltage, and the third threshold voltage is less than the fourth threshold voltage.

19. The method of claim 16 further comprising, if the selected cell belongs to the first portion, a reading using a reading voltage intermediate between the second and third threshold voltages for obtaining the bit.

* * * * *